United States Patent
Cheng et al.

(10) Patent No.: US 9,245,807 B2
(45) Date of Patent: Jan. 26, 2016

(54) INTEGRATED CIRCUIT WITH A THIN BODY FIELD EFFECT TRANSISTOR AND CAPACITOR

(71) Applicant: GlobalFoundries U.S. 2 LLC, Hopewell Junction, NY (US)

(72) Inventors: Kangguo Cheng, Schenectady, NY (US); Bruce Doris, Brewster, NY (US); Ali Khakifirooz, Mountain View, CA (US); Ghavam G. Shahidi, Pound Ridge, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 87 days.

(21) Appl. No.: 14/164,310

(22) Filed: Jan. 27, 2014

(65) Prior Publication Data
US 2014/0141575 A1    May 22, 2014

Related U.S. Application Data

(60) Division of application No. 13/614,908, filed on Sep. 13, 2012, now Pat. No. 8,652,898, which is a continuation of application No. 13/345,266, filed on Jan. 6, 2012, now Pat. No. 8,659,066.

(51) Int. Cl.
| | |
|---|---|
| H01L 21/84 | (2006.01) |
| H01L 21/8238 | (2006.01) |
| H01L 21/3205 | (2006.01) |
| H01L 27/06 | (2006.01) |
| H01L 27/12 | (2006.01) |
| H01L 29/417 | (2006.01) |

(52) U.S. Cl.
CPC .......... *H01L 21/84* (2013.01); *H01L 21/32053* (2013.01); *H01L 21/823814* (2013.01); *H01L 27/0629* (2013.01); *H01L 27/1203* (2013.01); *H01L 29/41783* (2013.01)

(58) Field of Classification Search
None
See application file for complete search history.

(56) References Cited

U.S. PATENT DOCUMENTS

| | | | |
|---|---|---|---|
| 6,057,572 A | 5/2000 | Ito et al. | ........................ 257/296 |
| 7,417,277 B2 | 8/2008 | Ohkubo et al. | |
| 7,820,505 B2 | 10/2010 | Brederlow et al. | |
| 7,875,919 B2 | 1/2011 | Booth, Jr. et al. | |

(Continued)

OTHER PUBLICATIONS

Non-Final Office Action dated Oct. 28, 2014 received for U.S. Appl. No. 14/168,208.

(Continued)

*Primary Examiner* — Jesse Y Miyoshi
*Assistant Examiner* — Abul Kalam

(57) ABSTRACT

A transistor region of a first semiconductor layer and a capacitor region in the first semiconductor layer are isolated. A dummy gate structure is formed on the first semiconductor layer in the transistor region. A second semiconductor layer is formed on the first semiconductor layer. First and second portions of the second semiconductor layer are located in the transistor region, and a third portion of the second semiconductor layer is located in the capacitor region. First, second, and third silicide regions are formed on the first, second, and third portions of the second semiconductor layer, respectively. After forming a dielectric layer, the dummy gate structure is removed forming a first cavity. At least a portion of the dielectric layer located above the third silicide region is removed forming a second cavity. A gate dielectric is formed in the first cavity and a capacitor dielectric in the second cavity.

5 Claims, 8 Drawing Sheets

(56) References Cited

U.S. PATENT DOCUMENTS

| | | | |
|---|---|---|---|
| 2001/0023108 A1 | 9/2001 | Miyano et al. | 438/300 |
| 2001/0030350 A1 | 10/2001 | Oowaki et al. | 257/410 |
| 2003/0132475 A1 | 7/2003 | Kanamori | 257/306 |
| 2006/0022302 A1 | 2/2006 | Brederlow et al. | 257/532 |
| 2006/0197134 A1 | 9/2006 | Phan et al. | 257/306 |
| 2007/0170548 A1 | 7/2007 | Akamatsu | 257/532 |
| 2007/0267705 A1 | 11/2007 | Won et al. | 257/379 |
| 2008/0019165 A1 | 1/2008 | Lin et al. | 365/102 |
| 2008/0173978 A1 | 7/2008 | Tu | 257/532 |
| 2009/0101956 A1 | 4/2009 | Booth et al. | 257/301 |
| 2009/0108314 A1 | 4/2009 | Cai et al. | |
| 2010/0133310 A1 | 6/2010 | Menzel et al. | |
| 2010/0213520 A1 | 8/2010 | Furuta et al. | |
| 2011/0024840 A1 | 2/2011 | Khater | |

OTHER PUBLICATIONS

Final Office Action dated Jul. 5, 2013 for U.S. Appl. No. 13/345,266.
Non Final Office Action dated Dec. 18, 2012 for U.S. Appl. No. 13/345,266.
Non Final Office Action dated May 2, 2013 for U.S. Appl. No. 13/614,908.
Mazure, C., et al., "FDSOI: From Substrate to Devices and Circuit Applications," 2010 ESSCIR 2010 Proceedings, Sep. 14-16, 2010, pp. 45-51, 978-1-4244-6664-1/10, copyright 2010 IEEE.

INTEGRATED CIRCUIT WITH A THIN BODY FIELD EFFECT TRANSISTOR AND CAPACITOR

CROSS-REFERENCE TO RELATED APPLICATIONS

This application is a divisional of and claims priority from U.S. patent application Ser. No. 13/614,908 filed on Sep. 13, 2012, the disclosure of which is continuation of and claims priority from U.S. patent application Ser. No. 13/345,266 filed on Jan. 6, 2012, now U.S. Pat. No. 8,659,066, the disclosures of which are hereby incorporated by reference in their entirety.

FIELD OF THE INVENTION

The present invention generally relates to the field of semiconductors, and more particularly relates to thin body field effect transistors (FETs).

BACKGROUND OF THE INVENTION

Fully depleted field effect transistors (FETs) with a thin body channel, such as extremely thin silicon-on-insulator (ETSOI) and finFET devices, are now being used due to their superior device characteristics. In addition to FETs, most integrated circuits also require on-chip capacitors, such as decoupling capacitors. However, capacitors formed by conventional complementary metal-oxide-semiconductor (CMOS) fabrication processes along with thin body FETs suffer from high resistance due to the high resistance of the thin body.

SUMMARY OF THE INVENTION

One embodiment discloses a method for fabricating an integrated circuit. The method comprises isolating a transistor region of a first semiconductor layer and a capacitor region in the first semiconductor layer. A dummy gate structure is formed on the first semiconductor layer in the transistor region. After forming the dummy gate structure, a gate spacer is formed on vertical sidewalls of the dummy gate structure. After forming the gate spacer, a second semiconductor layer is formed on the first semiconductor layer. First and second portions of the second semiconductor layer are located in the transistor region, and a third portion of the second semiconductor layer is located in the capacitor region. A first silicide region is formed on the first portion of the second semiconductor layer. A second silicide region is formed on the second portion of the second semiconductor layer. A third silicide region is formed on the third portion of the second semiconductor layer. A dielectric layer is formed that covers the first, second, and third silicide regions. After forming the dielectric layer, the dummy gate structure is removed so as to form a first cavity. At least a portion of the dielectric layer located above the third silicide region is removed so as to form a second cavity. A gate dielectric is formed in the first cavity and a capacitor dielectric in the second cavity. A gate conductor is formed in the first cavity and a metal electrode in the second cavity.

Another embodiment discloses another method for fabricating an integrated circuit. The method comprises isolating a transistor region of a first semiconductor layer and a capacitor region in the first semiconductor layer. A dummy gate structure is formed on the first semiconductor layer in the transistor region. After forming the dummy gate structure, a gate spacer is formed on vertical sidewalls of the dummy gate structure. After forming the gate spacer, a second semiconductor layer is formed on the first semiconductor layer. First and second portions of the second semiconductor layer are located in the transistor region. A third portion of the second semiconductor layer is located in the capacitor region. The dummy gate structure is removed so as to form a first cavity. A gate dielectric is formed in the first cavity. A gate conductor is formed in the first cavity. Trenches are formed in the dielectric layer so as to expose at least part of the first portion of the second semiconductor layer, at least part of the second portion of the second semiconductor layer, and at least part of the third portion of the second semiconductor layer. A first silicide region is formed on the exposed part of the first portion of the second semiconductor layer, a second silicide region on the exposed part of the second portion of the second semiconductor layer, and a third silicide region on the exposed part of the third portion of the second semiconductor layer. A capacitor dielectric is formed. A metal electrode is formed on the capacitor dielectric. At least a portion of the capacitor dielectric being located between the metal electrode and the third silicide region.

Other objects, features, and advantages of the present invention will become apparent from the following detailed description. It should be understood, however, that the detailed description and specific examples, while indicating various embodiments of the present invention, are given by way of illustration only and various modifications may naturally be performed without deviating from the present invention.

DETAILED DESCRIPTION

Embodiments of the present invention provide an integrated circuit that includes a fully depleted FET and an on-chip capacitor, and methods for forming such an integrated circuit. In one embodiment, an on-chip capacitor and a fully depleted FET share the same high-k dielectric and a metal layer, so as to greatly reduce process complexity and cost. Further, the capacitor has a low resistance silicide electrode and a low resistance metal electrode, so as to greatly improve the capacitor's electrical characteristics. In another embodiment, the capacitor is formed during a trench silicide/contact formation process. This allows the capacitor to have a high-k dielectric layer made of a different material than the gate dielectric of the FET, so as to achieve better electrical characteristics for the FET and the capacitor. Embodiments of the present invention are also applicable to other devices (such as finFETs and nanowire devices) in which epitaxial growth is used to form merged source/drains, as opposed to the raised source/drains of ETSOI devices.

Figure 1:
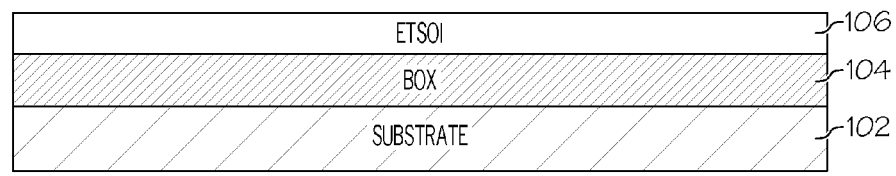
FIG. 1 is a cross-sectional view of a semiconductor structure after a first semiconductor layer has been formed on a buried insulator layer according to a first embodiment of the present invention.

FIGS. 1 to 8 illustrate a process for forming an integrated circuit that includes a fully depleted FET and an on-chip capacitor according to one embodiment of the present invention. As shown in FIG. 1, there is provided an SOI wafer having a silicon substrate 102, a buried insulator layer such as a buried oxide (BOX) 104, and a first semiconductor layer 106 such as an extremely thin silicon-on-insulator (ETSOI) layer. The ETSOI layer 106 of this embodiment has a thickness ranging from about 1 nm to 20 nm, while in another embodiment the ETSOI layer 106 has a thickness ranging from about 3 nm to 10 nm. In the illustrated embodiment, the SOI wafer is formed by thinning a "thick" SOI wafer (with a thickness in the 30 nm to 90 nm range) using oxidation and a hydrofluoric acid (HF) wet etch. The ETSOI layer 106 can be any semiconducting material, including but not limited to Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

An active area 206 for the FET and an area 210 for the capacitor are then defined within the ETSOI layer 106 through pad-film deposition, patterning (e.g., by photolithography), and reactive-ion etching (RIE). For example, a pad oxide having a thickness of 2 nm to 10 nm is formed in an oxidation furnace, and a pad nitride is deposited over the pad oxide using low-pressure chemical vapor deposition (LPCVD) or rapid-thermal chemical vapor deposition (RTCVD). Photolithography and a nitride-oxide-silicon RIE are then performed to define the active area 206 and capacitor area 210.

Figure 2:
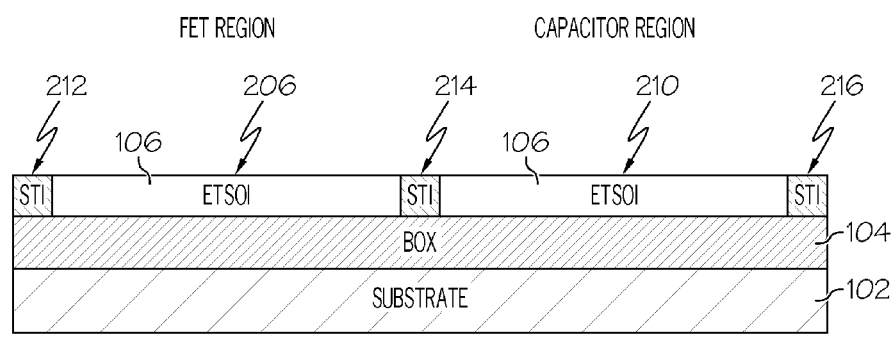
FIG. 2 is a cross-sectional view of the semiconductor structure of FIG. 1 after shallow trench isolation areas have been formed according to the first embodiment of the present invention.

Next, the active area 206 and capacitor area 210 are isolated, such as through shallow trench isolation (STI), Local Oxidation Of Silicon for Isolation (LOCOS), or mesa isolation. In this embodiment, STI is obtained through deposition of an STI oxide, densification anneals, and chemical-mechanical polishing (CMP) that stops on the pad nitride. This forms STI regions 212, 214, and 216 above the BOX layer 104 that are continuous around the active area 206 and capacitor area 210, as shown in FIG. 2. The pad nitride, along with any STI oxide remaining on the pad nitride, and the pad oxide are then removed (e.g., through wet etching using hot phosphoric acid and HF).

Figure 3:
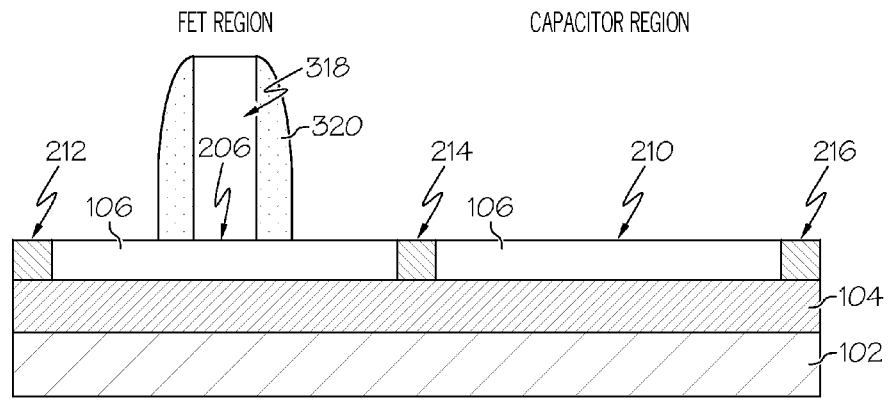
FIG. 3 is a cross-sectional view of the semiconductor structure of FIG. 1 after a dummy gate structure has been formed on an active area of a field-effect-transistor region according to the first embodiment of the present invention.

A dummy (or replacement) gate structure 318 is then formed on the active area 206 of the FET, as shown in FIG. 3. In this embodiment, the dummy gate 318 comprises multiple layers of oxide, polysilicon, amorphous silicon, nitride, or a combination thereof. Alternatively, the dummy gate 318 can comprise a single layer such as a nitride layer. Additionally, a gate spacer 320 comprising a dielectric material (such as silicon oxide, silicon nitride, silicon oxynitride, or a combination of these) is formed on the sidewalls of the dummy gate 318. In the illustrated embodiment, the dielectric material is formed and then reactive-ion etching is used to remove the dielectric material except from the sidewalls of the dummy gate 318.

Figure 4:
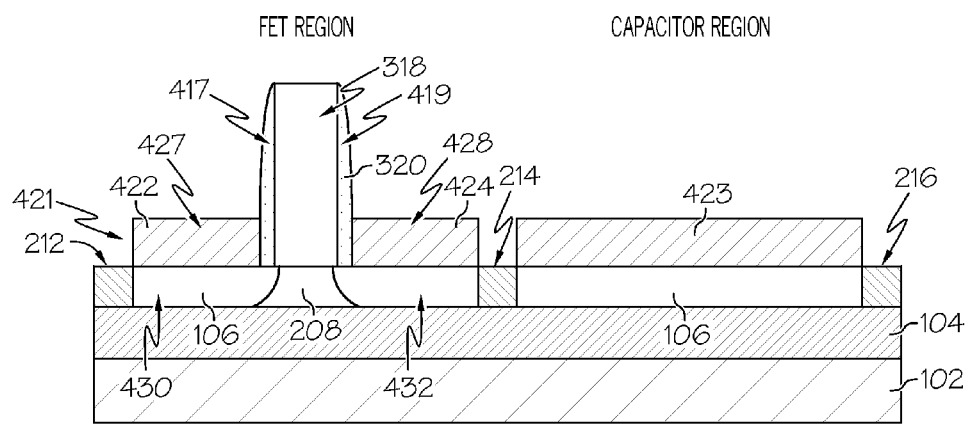
FIG. 4 is a cross-sectional view of the semiconductor structure of FIG. 1 after a second semiconductor layer has been formed on the active area of the field-effect-transistor and capacitor regions according to the first embodiment of the present invention.

As shown in FIG. 4, an additional layer 421 and 423 ("second semiconductor layer") is formed on exposed surfaces of the ETSOI layer 106 in both the FET and capacitor regions. In the illustrated example, the additional layer 421 in the FET region comprises a first portion 422 and a second portion 424 located on the sides of the gate spacer 320. In particular, the first portion 422 is formed on the ETSOI layer 106 between the first STI region 212 and a first wall 417 of the gate spacer 320, and the second portion 424 is formed between the second STI region 214 and a second wall 419 of the gate spacer 320. Another portion of the additional layer 423 is formed in the capacitor region over substantially the entire ETSOI layer 106 of the capacitor region.

In this embodiment, the additional layer 421 and 423 is formed through epitaxial growth, and can be formed undoped or doped with either p-type or n-type dopants. The portions 422 and 424 of the additional layer in the FET region form the raised source and drain regions of the FET. By controlling the chemical reactants and the system parameters, the deposited atoms arrive at the surface of the ETSOI layer 106 with sufficient energy to move around on the surface and orient themselves to the crystal arrangement of the atoms of the deposition surface. Thus, an epitaxial film deposited on a [100] crystal surface will take on a [100] orientation. If, on the other hand, the wafer has an amorphous surface layer, the deposited atoms have no surface to align to and form polysilicon instead of single crystal silicon. Silicon sources for the epitaxial growth include silicon tetrachloride, dichlorosilane (SiH2Cl2), and silane (SiH4). The temperature for this epitaxial silicon deposition is from 550° C. to 900° C.

Further, in the illustrated embodiment, the additional layer is formed through selective-epitaxial growth of SiGe atop the ETSOI layer 106. The Ge content of the epitaxial grown SiGe ranges from 5% to 60% (by atomic weight). In another embodiment, the Ge content of the epitaxially grown SiGe ranges from 10% to 40%. The epitaxially grown SiGe of the illustrated embodiment is under an intrinsic compressive strain that is produced by a lattice mismatch between the larger lattice dimension of the SiGe and the smaller lattice dimension of the layer on which the SiGe is epitaxially grown. The epitaxially grown SiGe produces a compressive strain in the portion of the ETSOI layer 106 in which the channel of the semiconductor device is formed.

In this embodiment, the additional layer 421 and 423 is doped with a first conductivity type dopant during the epitaxial growth process. P-type MOSFET devices are produced by doping the additional layer with elements from group III of the periodic table (e.g., boron, aluminum, gallium, or indium). As an example, the dopant can be boron in a concentration ranging from $1 \times 10E18$ atoms/cm3 to $2 \times 10E21$ atoms/cm3.

In another embodiment, the additional layer is composed of epitaxially grown Si:C (carbon doped silicon). The carbon (C) content of the epitaxially grown Si:C ranges from 0.3% to 10% (by atomic weight). In another embodiment, the carbon (C) content of the epitaxially grown Si:C ranges from 1% to 2%. In one embodiment, the epitaxially grown Si:C is under an intrinsic tensile strain that is produced by a lattice mismatch between the smaller lattice dimension of the Si:C and the larger lattice dimension of the layer on which the Si:C is epitaxially grown. The epitaxial grown Si:C produces a tensile strain in the ETSOI layer 106 in which the channel of the semiconductor device is formed. In this embodiment, the additional layer 421 and 423 is doped with a second conductivity type dopant during the epitaxial growth process. N-type MOSFET devices are produced by doping the semiconductor material 208 with elements from group V of the periodic table (e.g., phosphorus, antimony, or arsenic).

Alternatively, the additional layer 421 and 423 is a doped dielectric such as a doped oxide, formed by deposition such as through atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of those methods. In one embodiment, the dopant in the additional layer 421 and 423 is boron, arsenic, phosphorus, or indium, with a concentration ranging from $1 \times 10E18$ atoms/cm3 to $2 \times 10E21$ atoms/cm3.

As described above, the portions 422 and 424 of the additional layer 421 in the FET region provides the raised source and drain regions of the FET. In the illustrated embodiment in which the additional layer 421 and 423 in both the FET and capacitor regions is formed undoped, an implantation process can be performed to implant the additional layer of the capacitor and to form the source/drain regions and source/drain extensions of the FET. With respect to the FET, photolithography is used to selectively define NFET and PFET areas for deep source/drain and extension implants, and then ions are implanted. N-type species are implanted for NFETs, while P-type species are implanted for PFETs. A thermal anneal is then performed to activate and diffuse the implanted ions so as to form the raised source/drain regions 427 and 428 and the source/drain extensions 430 and 432, such as through a spike rapid-thermal anneal (RTA), and to also diffuse the implanted ions in the additional layer 423 of the capacitor. In another embodiment in which the additional layer 421 and 423 is doped, annealing (such as rapid thermal annealing, furnace annealing, flash lamp annealing, laser annealing, or any suitable combination thereof) can be used to drive the dopants from the additional layer 421 and 423 into the ETSOI layer 106 and to provide the extension regions 430 and 432 of the FET.

In the illustrated embodiment, for an NFET, the source/drain regions 427 and 428 are heavily doped with an N-type dopant, the source/drain extension regions 430 and 432 are lightly doped with the same or a different N-type dopant, and the halo regions are doped with a P-type dopant. Conversely, for a PFET, the source/drain regions 427 and 428 are heavily doped with a P-type dopant, the source/drain extension regions 430 and 432 are lightly doped with the same or a different P-type dopant, and the halo regions are doped with an N-type dopant.

Next, silicide areas 534, 536, and 538 are formed for contacts on the raised source/drain regions 427 and 428 of the FET and the additional layer 423 of the capacitor. In this embodiment, a metal is deposited on top of the raised source/drain regions 427 and 428 of the FET and the additional layer 423 of the capacitor. An anneal is then performed to form silicide, and then the metal is selectively removed. For example, the metal can be nickel, cobalt, titanium, platinum, or an alloy or combination thereof.

Figure 5:
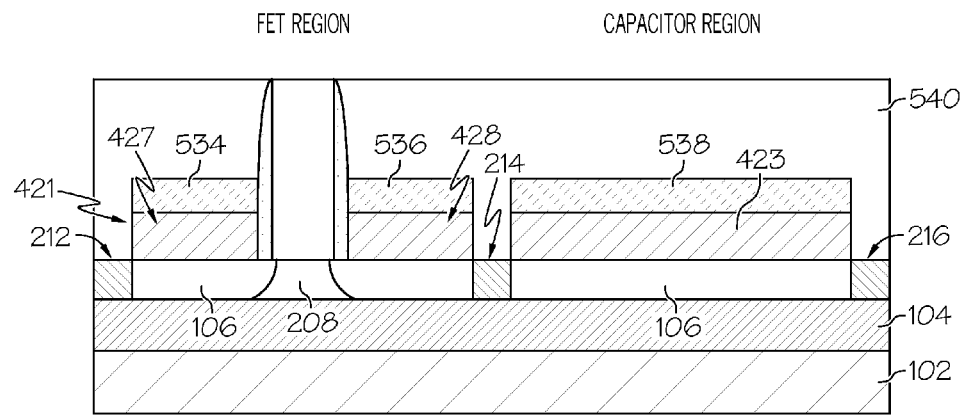
FIG. 5 is a cross-sectional view of the semiconductor structure of FIG. 1 after a dielectric layer has been formed over the structure according to the first embodiment of the present invention.
Figure 6:
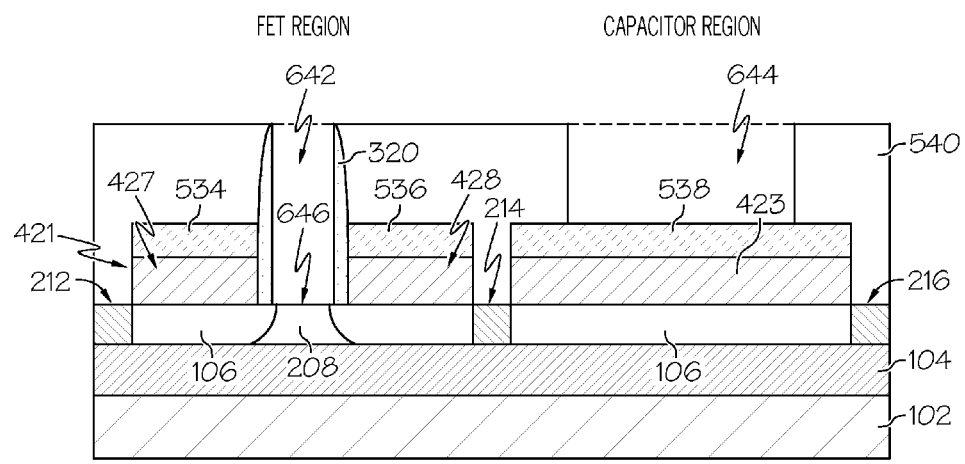
FIG. 6 is a cross-sectional view of the semiconductor structure of FIG. 1 after the dummy gate structure and a portion of the dielectric layer in the capacitor region have been removed according to the first embodiment of the present invention.

After the silicide areas 534, 536, and 538 have been formed, a first dielectric layer 540 (e.g., an oxide layer, nitride layer, low-k material or any suitable combination of those materials) is formed over the entire structure, as shown in FIG. 5. This dielectric layer 540 is then etched down to the level of the top surface of the dummy gate 318. Then, the dummy gate 318 is removed via selective etching or another technique to form a gate cavity 642 that exposes a portion 646 of the ETSOI layer 106, as shown in FIG. 6. A masking layer is then formed over the dielectric layer 540 and gate cavity 642 in the FET region, and also over portions of the silicide area 538 in the capacitor region. The unmasked area of the dielectric layer 540 of the capacitor is then removed by a patterning, (e.g., by photolithography followed by etching such as reactive-ion etching (RIE) process) to form a capacitor cavity 644 that exposes a portion of the silicide area 538, as shown in FIG. 6. Alternatively, the capacitor cavity can be formed prior to removing the dummy gate 318.

Figure 7:
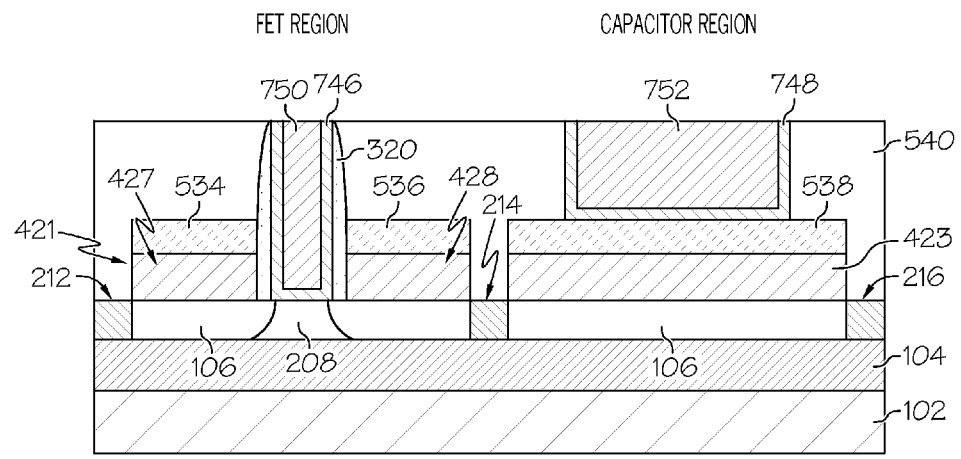
FIG. 7 is a cross-sectional view of the semiconductor structure of FIG. 1 after a high-k gate dielectric layer and a gate conductor layer have been formed in the field-effect-transistor region according to the first embodiment of the present invention.

After the cavities 642 and 644 have been formed, a high-k dielectric material is blanket deposited, for example by CVD (chemical vapor deposition), PECVD (plasma enhanced chemical vapor deposition), or ALD (Atomic layer deposition) followed by depositing one or more conductive materials to form high-k gate dielectric and metal gate. The excessive conductive material and high-k gate dielectric above the dielectric layer 540 can be removed, for example, by polishing such as chemically mechanical polishing (CMP) and/or etching to form a high-k gate dielectric 746 on the bottom (the exposed portion of the ETSOI layer 106) and vertical sidewalls of the gate cavity 642 of the FET region, and a high-k capacitor dielectric 748 on the bottom (the exposed portion of the silicide area 538) and vertical sidewalls of the capacitor cavity 644, and a gate conductor 750 in the gate cavity 642 and a metal electrode (terminal) 752 in the capacitor cavity 644, as shown in FIG. 7. The gate conductor 750 fills the remaining portion of the gate cavity 642 and the metal electrode 752 fills the remaining portion of the capacitor cavity 644.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. An interfacial layer (not shown) may be formed on top of the channel 208 before depositing high-k material. The interfacial layer, includes but is not limited to, silicon oxide, silicon nitride, silicon oxynitride that can be formed by chemical oxidation, low temperature oxidation, nitridation, and/or oxynitridation process.

In the illustrated embodiment, the conductive material comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The conductive material may comprises multiple layers such as gate workfunction setting layer and gate conductive layer.

Figure 8:
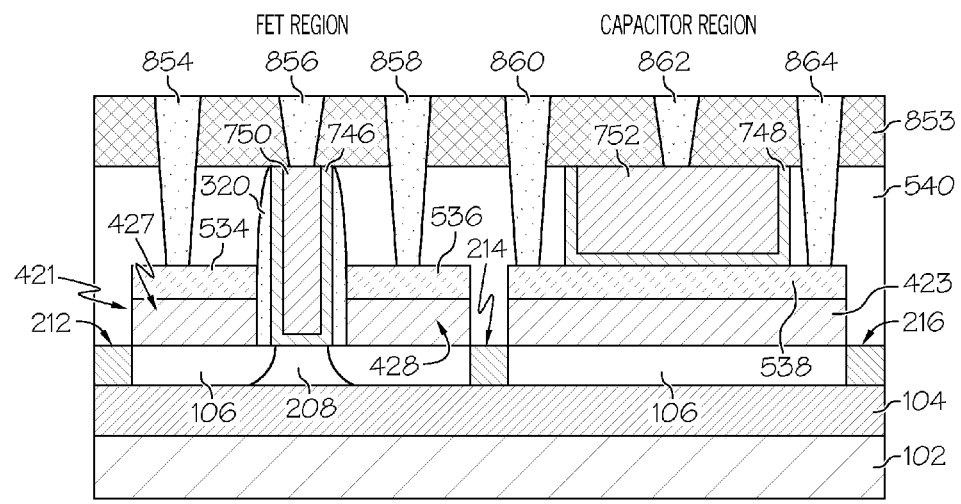
FIG. 8 is a cross-sectional view of the semiconductor structure of FIG. 1 after contacts have been formed in the field-effect-transistor region and the capacitor region according to the first embodiment of the present invention.

After the gate conductor 750 and metal electrode 752 have been formed, a second dielectric layer 853, comprising an oxide layer, nitride layer, low-k material or any suitable combination of those materials, in this embodiment, is then formed over the entire structure, as shown in FIG. 8. Contacts 854, 856, and 858 are then formed for the silicide areas 534 and 536 and the gate conductor 750 of the FET. Contacts 860, 862, and 864 are also formed to the silicide area 538 adjacent to the vertical sidewalls of the high-k capacitor dielectric 748, and also to the metal electrode 752, as shown in FIG. 8. A conventional process is used to form the contacts.

The above process produces a FET having a high-k gate dielectric and a metal gate, and a capacitor having a metal electrode (terminal), high-k capacitor dielectric, and another electrode (terminal) comprising a silicide. Thus, a high-k/metal gate FET and a low resistance capacitor are fabricated simultaneously. Also, because the FET and capacitor are formed using the same dielectric and metal materials, low fabrication costs are achieved.

Figure 9:
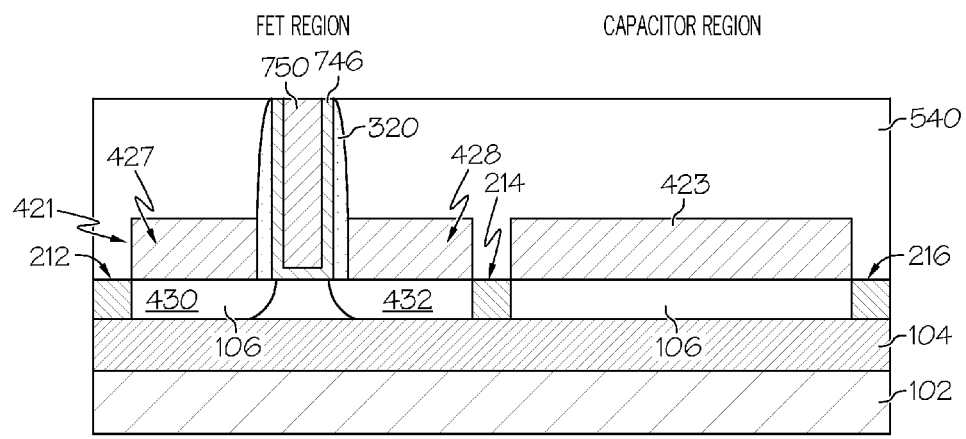
FIG. 9 is a cross-sectional view of a semiconductor structure after a dielectric layer has been formed over a field-effect-transistor region and a capacitor region according to a second embodiment of the present invention.

FIGS. 9 to 12 illustrate the relevant portion of a process for forming an integrated circuit that includes a fully depleted FET and an on-chip capacitor according to another embodiment of the present invention. In the embodiment of FIGS. 9 to 12, the capacitor is formed during a trench silicide process. In this embodiment, the dummy gate structure 318 and gate spacer 320 are formed as described above. Then, prior to forming the additional layer 421 and 423, the dummy gate 318 is removed to form a gate cavity 642. A high-k dielectric layer is blanket deposited, for example by CVD (chemical vapor deposition), PECVD (plasma enhanced chemical vapor deposition), or ALD (Atomic layer deposition) followed by depositing one or more conductive materials to form high-k gate dielectric and metal gate. The excessive conductive material and high-k gate dielectric above the dielectric layer 540 can be removed, for example, by polishing such as chemically mechanical polishing (CMP) and/or etching. This forms a high-k gate dielectric 746 on the bottom (the exposed portion of the ETSOI layer 106) and vertical sidewalls of the gate cavity 642 of the FET region, and a gate conductor 750 in the gate cavity 642, as shown in FIG. 9. The gate conductor 750 fills the remaining portion of the gate cavity 642.

Figure 10:
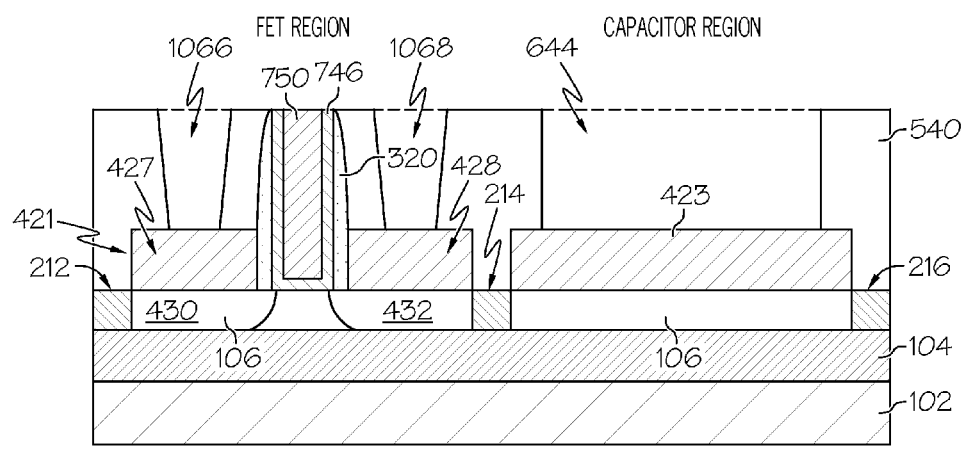
FIG. 10 is a cross-sectional view of the semiconductor structure of FIG. 9 after portions of the dielectric layer have been removed in the field-effect-transistor region and the capacitor region according to the second embodiment of the present invention.
Figure 11:
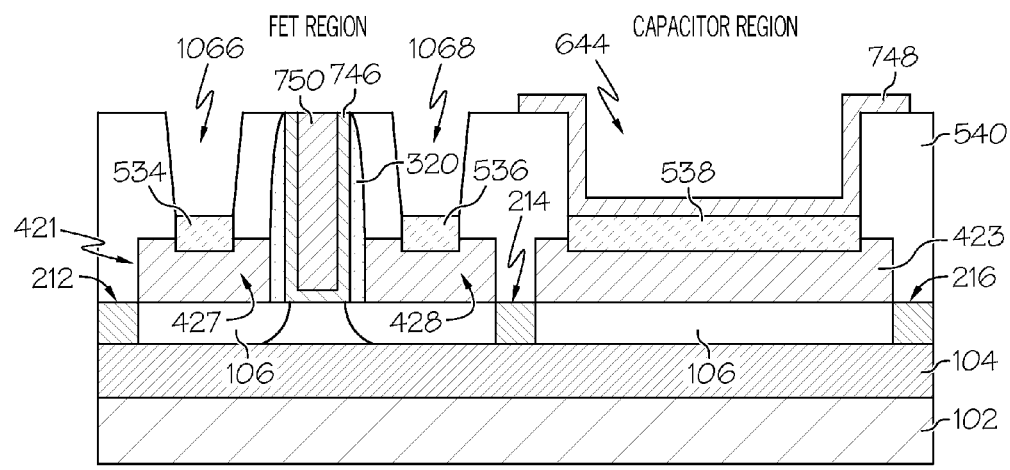
FIG. 11 is a cross-sectional view of the semiconductor structure of FIG. 9 after silicide regions have been formed in the field-effect-transistor region and the capacitor region according to the second embodiment of the present invention.

After the gate stack has been formed in the FET region, the additional layer 421 and 423 is then formed using the process described above. The source/drain regions 427 and 428 and the source/drain extensions 430 and 432 are then formed. In this embodiment, the source/drain regions 427 and 428 are merged source/drains. A dielectric layer 540 (e.g., an oxide layer, nitride layer, low-k material or any suitable combination of those materials) is then formed over the entire structure, as shown in FIG. 9. Next, portions of the dielectric layer 540 over the additional layer 421 and 423 are removed (e.g., through a dry etch such as RIE and/or a wet etch using HF) so as to create contact trenches/openings 1066 and 1068 in the FET region, and a capacitor trench/opening 644 in the capacitor region, as shown in FIG. 10. Silicide regions 534, 536, and 538 are then formed within the contact openings 1066 and 1068 and the capacitor cavity 644, as shown in FIG. 11. In this embodiment, a metal is deposited on top of the source/drain regions 427 and 428 and the additional layer 423 of the capacitor. An anneal is then performed to form silicide, and then the metal is selectively removed. For example, the metal is nickel, cobalt, titanium, platinum, or an alloy or combination thereof.

Figure 12:
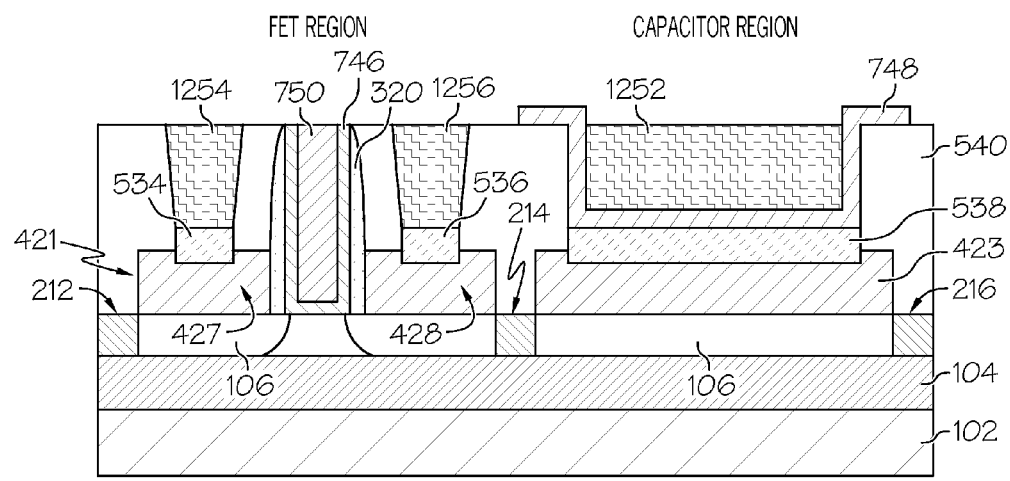
FIG. 12 is a cross-sectional view of the semiconductor structure of FIG. 9 after contacts have been formed in the field-effect-transistor region and the capacitor region according to the second embodiment of the present invention.

After the silicide regions 534, 536, and 538 have been formed, a high-k dielectric material is blanket deposited, for example by CVD (chemical vapor deposition), PECVD (plasma enhanced chemical vapor deposition), or ALD (Atomic layer deposition) followed by depositing one or more conductive materials to form high-k gate dielectric and metal gate for the capacitor. The excessive conductive material and high-k gate dielectric above the dielectric layer 540 can be removed, for example, by polishing such as chemically mechanical polishing (CMP) and/or etching to form a high-k capacitor dielectric 748 on the bottom (the exposed portion of the silicide area 538) and vertical sidewalls of the capacitor cavity 644, and a metal electrode (terminal) 1252 in the capacitor cavity 644, as shown in FIG. 12. The metal electrode 1252 fills the remaining portion of the capacitor cavity 644. It should be noted that the capacitor and the transistor can have same high-k dielectric material, but with different thicknesses.

After the gate conductor 750 and metal electrode 1252 have been formed, contacts 1254 and 1256 are then formed for the silicide areas 534 and 536 and in the contact openings 1066 and 1068, as shown in FIG. 12. A conventional process is used to form the contacts.

Figure 13:
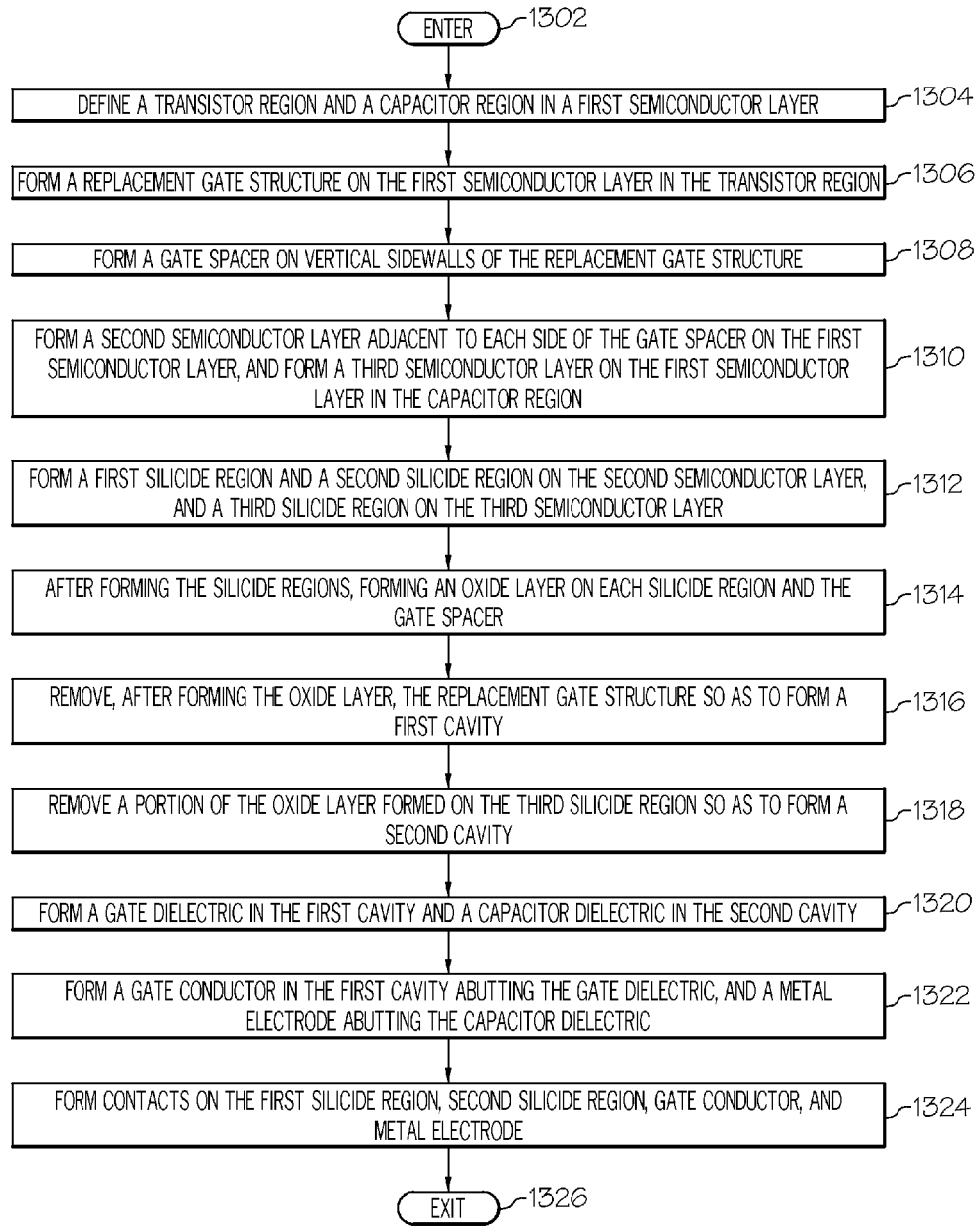
FIG. 13 is an operational flow diagram illustrating a process for forming a fully depleted FET and an on-chip capacitor according to one embodiment of the present invention.

FIG. 13 is an operational flow diagram illustrating a process for forming an integrated circuit that includes a fully depleted FET and an on-chip capacitor according to one embodiment of the present invention. A transistor region and a capacitor region are defined in a first semiconductor layer, at step 1304. A dummy gate structure is formed on the first semiconductor layer in the transistor region, at step 1306. After forming the dummy gate structure, a gate spacer is formed on vertical sidewalls of the dummy gate structure, at step 1308. After forming the gate spacer, a second semiconductor layer is formed adjacent to each side of the gate spacer on the first semiconductor layer, and a third semiconductor layer is formed on the first semiconductor layer in the capacitor region, at step 1310.

A first silicide region and a second silicide region are formed on the second semiconductor layer, and a third silicide region is formed on the third semiconductor layer, at step 1312. After forming the silicide regions, an oxide layer is formed on the silicide regions and the gate spacer, at step 1314. After forming the oxide layer, the dummy gate structure is removed so as to form a first cavity, at step 1316. A portion of the oxide layer formed on the third silicide region is removed so as to form a second cavity, at step 1318. A gate dielectric is formed in the first cavity and a capacitor dielectric is formed in the second cavity, at step 1320. A gate conductor is formed in the first cavity abutting the gate dielectric, and a metal electrode is formed within the second cavity abutting the capacitor dielectric, at step 1322. Contacts are then formed on the silicide areas and the gate conductor of the FET, and contacts are also formed on portions of the silicide area that are adjacent to the vertical sidewalls of the high-k capacitor dielectric, and also on a portion of the metal electrode, at step 1324.

Figure 14:
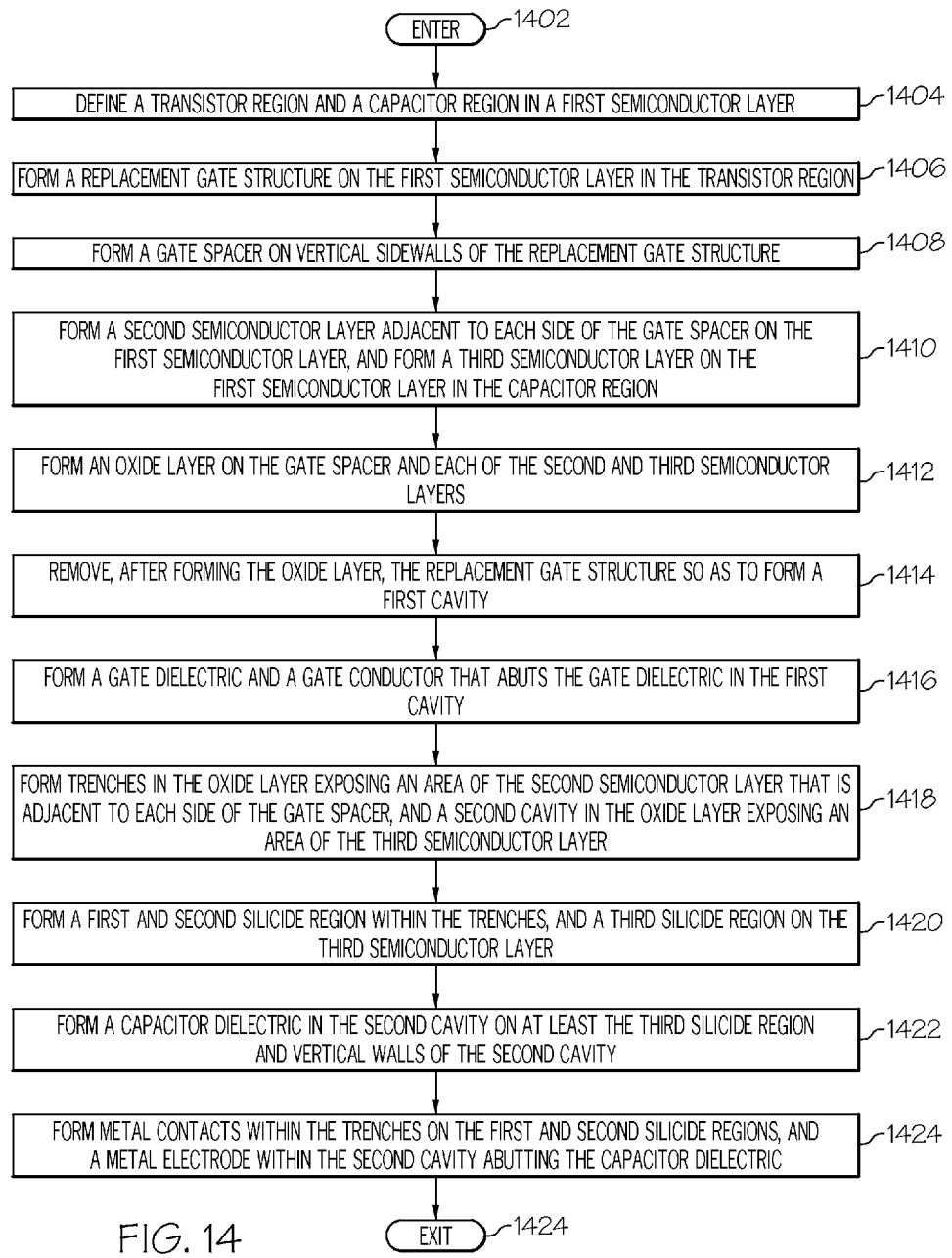
FIG. 14 is an operational flow diagram illustrating another process for forming a fully depleted FET and an on-chip capacitor according to another embodiment of the present invention.

FIG. 14 is an operational flow diagram illustrating a process for forming an integrated circuit that includes a fully depleted FET and an on-chip capacitor according to another embodiment of the present invention. A transistor region and a capacitor region are defined/isolated in a first semiconductor layer, at step 1404. A dummy gate structure is formed on the first semiconductor layer in the transistor region, at step 1406. After forming the dummy gate structure, a gate spacer is formed on vertical sidewalls of the dummy gate structure, at step 1408. After forming the gate spacer, a second semiconductor layer is formed adjacent to each side of the gate spacer on the first semiconductor layer, and a third semiconductor layer is formed on the first semiconductor layer in the capacitor region, at step 1410.

An oxide layer is then formed on the gate spacer and the second and third semiconductor layers, at step 1412. After forming the oxide layer, the dummy gate structure is removed so as to form a first cavity, at step 1414. A gate dielectric is formed in the first cavity, and a gate conductor is formed in the first cavity abutting the gate dielectric, at step 1416. Trenches are formed within the oxide layer to expose areas of the second semiconductor layer that are adjacent to the sides of the gate spacer, and a second cavity is formed in the oxide layer exposing an area of the third semiconductor layer, at step 1418. A first silicide region and a second silicide region are formed within the trenches on the second semiconductor layer, and a third silicide region is formed on the third semiconductor layer, at step 1420. A capacitor dielectric is formed at least on the third silicide region and vertical sidewalls of the second cavity, at step 1422. Metalized contacts are formed within the trenches for the FET, and a metal electrode for the capacitor is formed within the second cavity abutting the capacitor dielectric, at step 1424.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating an integrated circuit, the method comprising:
    isolating a transistor region of a first semiconductor layer and a capacitor region in the first semiconductor layer;
    forming a dummy gate structure on the first semiconductor layer in the transistor region;
    after forming the dummy gate structure, forming a gate spacer on vertical sidewalls of the dummy gate structure;
    after forming the gate spacer, forming a second semiconductor layer on the first semiconductor layer, first and second portions of the second semiconductor layer being in contact with first and second portions, respectively, of the first semiconductor layer located in the transistor region, and a third portion of the second semiconductor layer being in contact with a third portion of the first semiconductor layer located in the capacitor region, wherein the first, second, and third portions of the second semiconductor layer are non-continuous portions;
    removing the dummy gate structure so as to form a first cavity;
    forming a gate dielectric in the first cavity;
    forming a gate conductor in the first cavity;
    forming a dielectric layer over and in contact with at least the gate spacer and the second semiconductor layer;
    forming trenches in the dielectric layer so as to expose at least part of the first portion of the second semiconductor layer, at least part of the second portion of the second semiconductor layer, and at least part of the third portion of the second semiconductor layer;
    forming a first silicide region on the exposed part of the first portion of the second semiconductor layer, a second silicide region on the exposed part of the second portion of the second semiconductor layer, and a third silicide region on the exposed part of the third portion of the second semiconductor layer;
    forming a capacitor dielectric; and
    forming a metal electrode on the capacitor dielectric, at least a portion of the capacitor dielectric being located between the metal electrode and the third silicide region.

2. The method of claim 1, further comprising forming metal contacts that cover the first and second silicide regions.

3. The method of claim 1, further comprising forming merged source/drain regions in the first and second portions of the second semiconductor layer.

4. The method of claim 1, further comprising:
    providing a silicon substrate;
    forming a buried insulator layer on the silicon substrate; and
    forming the first semiconductor layer on the buried insulator layer, the first semiconductor layer comprising silicon and having a thickness of less than about 10 nanometers.

5. The method of claim 1, further comprising epitaxially growing the second semiconductor layer on the first semiconductor layer, the second semiconductor layer comprising silicon-germanium.

* * * * *